United States Patent
Traub

(10) Patent No.: US 6,806,785 B2
(45) Date of Patent: Oct. 19, 2004

(54) OSCILLATOR CIRCUIT USING BONDING WIRES FOR INDUCTORS AND HAVING A RESONANCE TRANSFORMATION CIRCUIT

(75) Inventor: Johann Traub, Lauingen (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/440,781

(22) Filed: May 19, 2003

(65) Prior Publication Data

US 2003/0189468 A1 Oct. 9, 2003

Related U.S. Application Data

(63) Continuation of application No. PCT/DE01/04249, filed on Nov. 13, 2001.

(30) Foreign Application Priority Data

Nov. 17, 2000 (DE) .......................................... 100 56 943

(51) Int. Cl.[7] .......................................... H03B 5/12
(52) U.S. Cl. ............................... 331/108 C; 331/36 L; 331/117 R; 331/117 FE; 331/167; 257/531
(58) Field of Search .......................... 331/108 C, 36 L, 331/117 R, 167; 257/531

(56) References Cited

U.S. PATENT DOCUMENTS

| | | | |
|---|---|---|---|
| 5,850,595 A | 12/1998 | Rieger et al. | ................ 455/317 |
| 6,046,647 A | * | 4/2000 | Nelson ........................ 331/105 |

FOREIGN PATENT DOCUMENTS

EP 0 347 993 A2 12/1989

OTHER PUBLICATIONS

Steyaert, M. et al.: "1.1.GHz Oscillator Using Bondwire Inductance", Electronic Letters, vol. 30, No. 3, 1994, pp. 244–245.

Svelto, F. et al.: "A 1.3GHz Low–Phase Noise Fully Tunable CMOS LC VCO", IEEE Journal on Solid State Circuits, vol. 35, No. 3, Mar. 2000, pp. 356–361.

Pfaff, D. et al.: "Low Power Circuits for Re–Frequency Synthesizers in the Low GHz Range", Integrated Systems Laboratory, Institute of Technology, Zurich, pp. 1–18.

Hung, C.–M. et al.: A Packaged 1.1–GHz CMOS VCO with Phase Noise of—126 dBc/Hz at a 600–kHz Offset, IEEE Journal of Solid–State Circuits. vol. 35, No. 1, Jan. 2000, pp. 100–103.

Craninckx, J. et al.: "A 1.8–GHz CMOS Low–Phase–Noise Voltage–Controlled Oscillator with Prescaler", IEEE Journal of Solid–State Circuits, vol. 30, No. 12, Dec. 1995, pp. 1474–1482.

* cited by examiner

Primary Examiner—Arnold Kinkead
(74) Attorney, Agent, or Firm—Laurence A. Greenberg; Werner H. Stemer; Ralph E. Locher

(57) ABSTRACT

An oscillator circuit includes an oscillator core having two capacitances, two inductors designed as bonding wires, and a de-attenuation amplifier coupled to the oscillator core. The inductors of the oscillator core, which is preferably embodied to be tunable, are connected to a leadframe by a respective terminal. A chip including the oscillator core and the deattentuation amplifier is configured on the leadframe. A resonance transformation circuit is preferably provided for coupling the oscillator core and the de-attenuation amplifier. The oscillator can be used in a mobile radio when there are high requirements with regard to the phase noise.

8 Claims, 2 Drawing Sheets

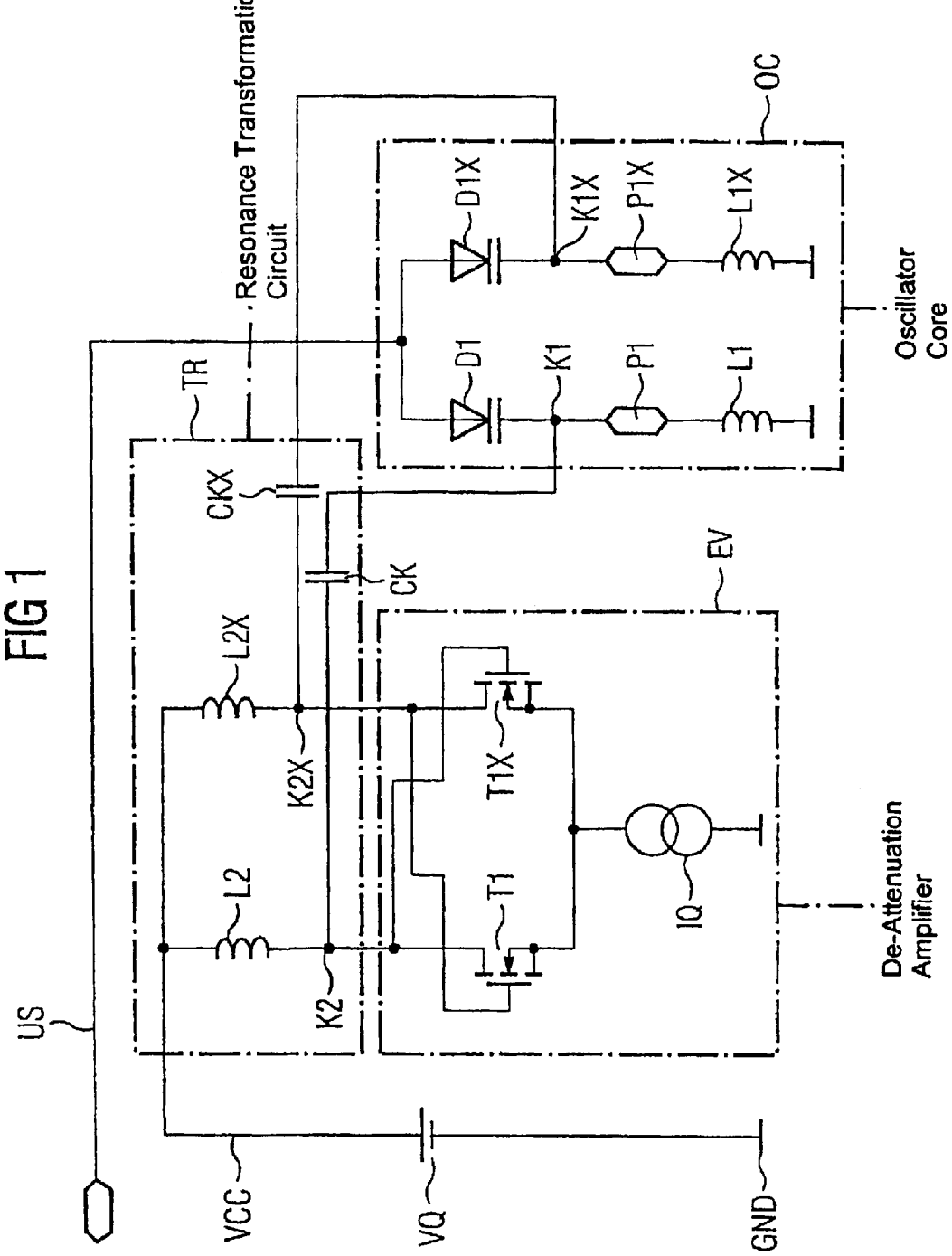

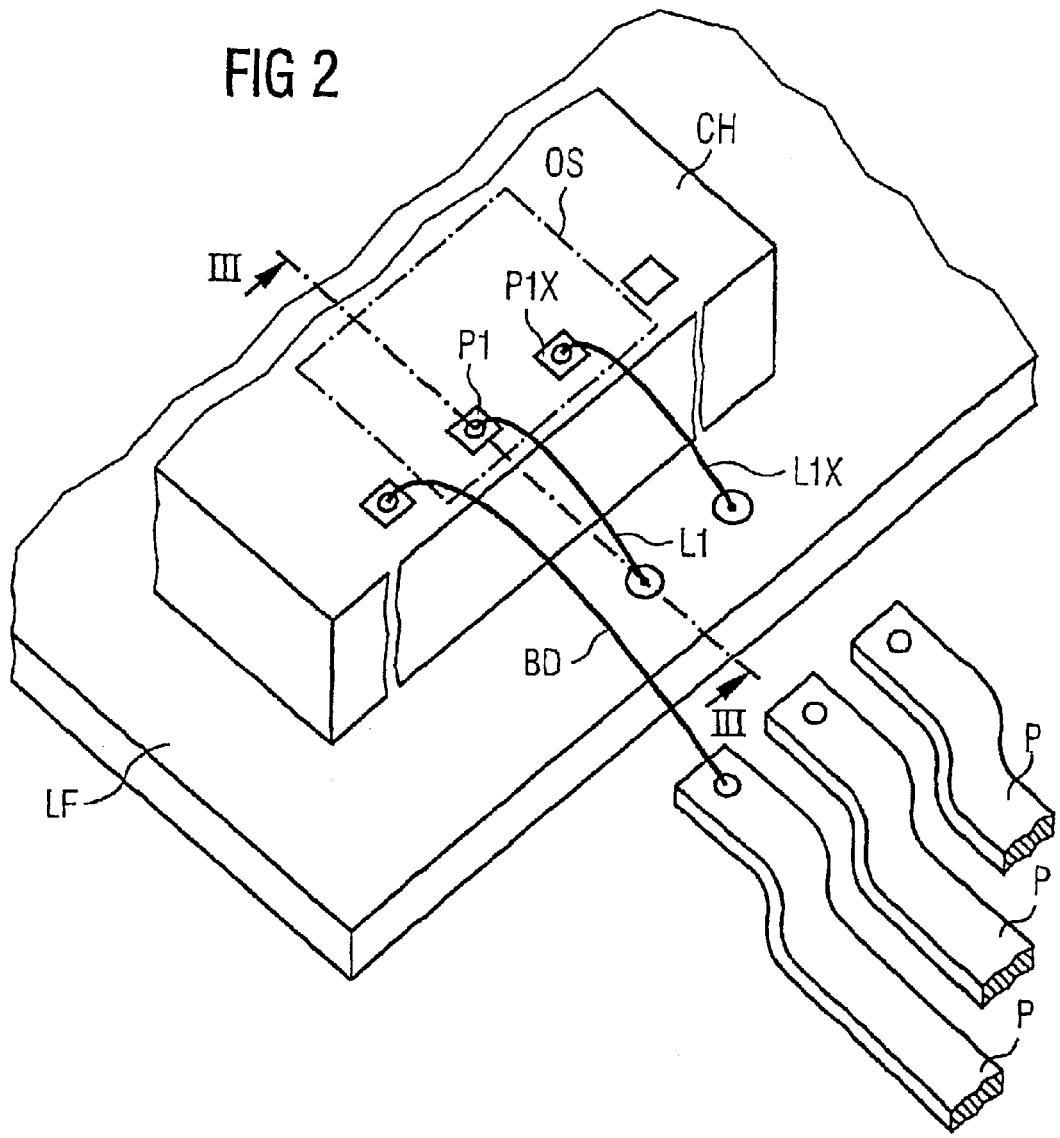
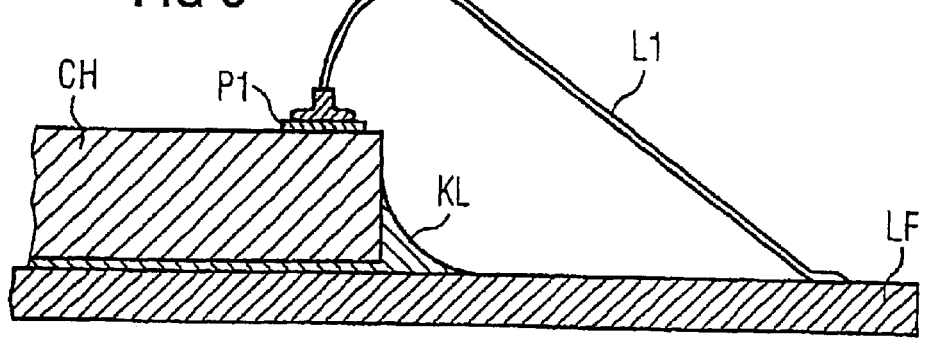

OSCILLATOR CIRCUIT USING BONDING WIRES FOR INDUCTORS AND HAVING A RESONANCE TRANSFORMATION CIRCUIT

CROSS-REFERENCE TO RELATED APPLICATION

This application is a continuation of copending International Application No. PCT/DE01/04249, filed Nov. 13, 2001, which designated the United States and was not published in English.

BACKGROUND OF THE INVENTION

Field of the Invention

The present invention relates to an oscillator circuit.

In mobile radio, for example, fully integrated VCO's (voltage-controlled oscillators) are used in the gigahertz range, high requirements with regard to phase noise being imposed on the oscillators. At the same time, there is a desire for integrated circuits which require as little space as possible, chips with the smallest possible number of terminal pins and good properties with regard to electromagnetic compatibility.

Integrated VCOs can be realized as LC oscillators, for example. While the integration of the resonant circuit capacitances for such VCOs can be realized comparatively simply and with a small chip area requirement, the integration for realization of the resonator inductors is comparatively complicated. Examples of possible realizations of inductors are spiral arrangements arranged for example on an integrated circuit or printed circuit board, active inductors which can be realized with a capacitance and a gyrator circuit connected thereto, and the utilization of actually parasitic inductive properties of bonding wires. It holds true here as a rule of thumb formula that the inductance of a bonding wire is approximately 1 nH per mm.

The advantage of bonding wires as inductors in LC oscillators resides in the high quality factor that can be achieved. In the case of the bonding wires, a distinction is made between the bonding of pads, that is to say contact points on a chip, to a pin, of a pad to a carrier element of the chip, and of one pad of the chip to another.

The document "A 1.8-GHz CMOS Low-Phase-Noise Voltage-Controlled Oscillator with Prescaler", Jan Craninckx, M. Steyaert, IEEE Journal on Solid-State Circuits, Vol. 30, No. 12, 1995, pages 1474 to 1482, specifies the implementation of a VCO in a PLL (phase-locked loop). In this case, the VCO is embodied as a tunable LC oscillator. Bonding wire inductances are provided as inductors in the LC oscillator. In this case, the bonding wire inductors are embodied from one contact point of the chip to another contact point of the chip, which requires a very large chip area requirement.

The document "A packaged 1.1-GHz CMOS VCO with Phase Noise of −126 dBc/Hz at a 600-kHz Offset", Hung et al., IEEE Journal on Solid-State Circuits, Vol. 35, No. 1, 2000, pages 100 to 103, likewise discloses a voltage-controlled oscillator, in which a combination of a spiral inductive element integrated on the chip, a plurality of bonding wires from the chip to pins, and intermediate pins is provided for the realization of the inductor of the LC oscillator. This requires four additional pins on the chip and, moreover, a larger chip area requirement and undesirable signal couplings to the housing result.

The document "A 1.3 GHz Low-Phase Noise Fully Tuneable CMOS LC VCO", F. Svelto et al., IEEE Journal on Solid-State Circuits, Vol. 35, No. 3, 2000, pages 356 to 361, likewise specifies a voltage-controlled LC oscillator. Here, too, bonding wire inductances are provided which produce the inductors of the LC core in addition to integrated inductors. This combination also leads to a high chip area and pin requirement of the arrangement.

SUMMARY OF THE INVENTION

It is accordingly an object of the invention to provide an oscillator circuit which overcomes the above-mentioned disadvantages of the prior art apparatus of this general type. In particular, it is an object of the present invention to provide an oscillator circuit having a small chip area requirement, a high quality factor, and good phase noise properties.

With the foregoing and other objects in view there is provided, in accordance with the invention, an oscillator circuit, including: a supply voltage source having a supply potential terminal and a reference-ground potential terminal; a carrier; a semiconductor chip having a front side and a rear side fixed to the carrier; and an oscillator core integrated on the semiconductor chip. The oscillator core includes a pair of first circuit nodes, a first capacitance, a first inductor connected to the first capacitance at a first one of the pair of first circuit nodes, a second capacitance, and a second inductor connected to the second capacitance at a second one of the pair of first circuit nodes. The oscillator circuit also includes a de-attenuation amplifier integrated on the semiconductor chip. The de-attenuation amplifier is coupled to the oscillator core and to the supply voltage source. The oscillator circuit also includes a pair of contact points. The first inductor is formed as a bonding wire having a first terminal connected to a first one of the pair of contact points and a second terminal connected to the carrier. The second inductor is formed as a bonding wire having a first terminal connected to a second one of the pair of contact points and a second terminal connected to the carrier. The first one of the pair of contact points is connected to the first one of the pair of first circuit nodes. The second one of the pair of contact points is connected to the second one of the pair of first circuit nodes.

In accordance with an added feature of the invention, the second terminal of the bonding wire forming the first inductor is connected to the reference-ground potential terminal; and the second terminal of the bonding wire forming the second inductor is connected to the reference-ground potential terminal.

In accordance with an additional feature of the invention, the semiconductor chip has a p-type substrate.

In accordance with another feature of the invention, an adhesive fixes the rear side of the semiconductor chip on a carrier.

In accordance with a further feature of the invention, there is provided: a resonance transformation circuit coupling the oscillator core and the de-attenuation amplifier; a pair of second circuit nodes; a further inductor connected to a first one of the pair of second circuit nodes; and another further inductor connected to a second one of the pair of second circuit nodes. The resonance transformation circuit includes a first coupling capacitor connected to the first one of the pair of first circuit nodes and to the first one of the pair of second circuit nodes. The resonance transformation circuit includes a second coupling capacitor connected to the second one of the pair of first circuit nodes and to the second one of the pair of second circuit nodes.

In accordance with a further added feature of the invention, the de-attenuation amplifier has at least one NMOS transistor.

In accordance with a further additional feature of the invention, the first capacitance is embodied as a first varactor diode having a voltage-dependent capacitance value; and the second capacitance is embodied as a second varactor diode having a voltage-dependent capacitance value.

In accordance with yet an added feature of the invention, there is provided, a terminal for obtaining a control voltage for setting the capacitance value of the first varactor diode and for setting the capacitance value of the second varactor diode. The first varactor diode has an anode, and the second varactor diode has an anode connected to the anode of the first varactor diode. The terminal for obtaining the control voltage is connected to the anode of the first varactor diode and to the anode of the second varactor diode.

In accordance with yet another feature of the invention, the oscillator core and the resonance transformation circuit are symmetrically designed for carrying differential signals; and the de-attenuation amplifier is a differential amplifier having two cross-coupled transistors.

The semiconductor chip may be designed as a chip. The carrier may, for example, be part of a leadframe on which the semiconductor chip is arranged. On the carrier, conductor tracks may run outside the semiconductor chip, to which conductor tracks, the second terminals of the bonding wires may be connected. The carrier may be a printed circuit board. The carrier may be a metallic carrier. The carrier may be a further semiconductor chip. The carrier may be electrically and/or thermally conductively connected to the semiconductor chip, in particular, to the substrate thereof, in a large-area manner.

In this case, no additional bonding wires are necessary since the oscillator core having the inductors can be coupled to the supply and reference-ground potential terminal anyway. Moreover, no additional pins are necessary on the chip since the bonding wire inductors are not connected to pins, but rather on the carrier, that is to say, they lead from a contact point on the semiconductor chip, also referred to as pad, to a carrier element, also referred to as die pad, on which the semiconductor chip can be fixed.

The carrier element or leadframe is usually electrically connected to the semiconductor substrate of a semiconductor chip, for example, using a conductive adhesive. If a chip with the p-type substrate is involved in this case, then bonding wires, which are electrically conductively connected on the carrier element, are directly connected to the reference-ground potential terminal of the oscillator circuit if, as in a preferred embodiment of the invention, the rear side of the semiconductor chip is arranged on- the leadframe. In this case, all of the components of the oscillator circuit, including the oscillator core without the inductors and also the de-attenuation amplifier, can be integrated completely and monolithically on the chip.

In the case of the oscillator circuit, the bonding wires provide the LC oscillator core with the inductive portion, which is actually a parasitic inductive portion in the case of bonding wires. This parasitic inductance of the bonding wires that are necessary anyway for connecting the oscillator circuit to reference-ground and supply potential is accordingly utilized in an advantageous manner in accordance with the present principle.

In one preferred embodiment of the invention, the second terminals of the first and second inductors are connected to the reference-ground potential terminal of the oscillator circuit.

In a further preferred embodiment of the invention, the chip has a p-doped substrate. The bonding wires may then be connected to pads on the active front side of the chip, while the rear side of the chip may be fixed on the leadframe.

The chip is fixed on the leadframe preferably by an adhesive. This adhesive may be electrically and/or thermally conductive.

In a further preferred embodiment of the oscillator circuit, a resonance transformation circuit is provided for coupling the oscillator core and the de-attenuation amplifier. This resonance transformation circuit includes a pair of coupling capacitors, which are each connected to a respective first circuit node and to a respective further inductor at a respective second circuit node.

In this case, the de-attenuation amplifier is connected to the second circuit nodes. The resonance transformation first affords the advantage that the oscillator core, which may be embodied such that it is tunable, realizes a low-impedance circuit section with a resonator having a high quality factor, while a series resonant circuit is formed with coupling capacitors and further inductors, which may be integrated. This series resonant circuit performs a resonance transformation between the low-impedance first circuit node and the high-impedance second circuit node. This has the advantage that the de-attenuation amplifier, which may be a differential amplifier, for example, is connected to a high-impedance circuit node.

In this case, the resonator in the oscillator core may be embodied such that it is tunable as a parallel resonator. The resonator can guide the frequency of the integrated series resonant circuit within its high bandwidth. The further inductor may be directly connected to the supply potential terminal and the de-attenuation amplifier may be connected to the reference-ground potential terminal, for example, via a current source.

The resonance transformation furthermore has the effect that a higher amplitude of an oscillating signal occurs at the second circuit node than at the first circuit node. The lower oscillation amplitude there has the advantage that the capacitances of the oscillator core, which may be embodied as tunable diodes, for example, do not enter into a conducting state on account of the low amplitude.

Finally, the described oscillator circuit with the resonance transformation circuit makes it possible that, despite the inductors of the oscillator core, which may be directly connected to the reference-ground potential terminal, it is possible to use NMOS instead of PMOS transistors or NPN instead of PNP transistors in the de-attenuation amplifier. N-channel MOS transistors have the advantage over P-channel transistors of the higher transconductance and hence a larger gain in conjunction with a smaller design. In the case of a bipolar circuit realization that is likewise possible, npn transistors have better radio frequency properties compared with pnp transistors, just as NMOS transistors do compared with PMOS transistors.

In a further advantageous embodiment of the present invention, the de-attenuation amplifier has at least one NMOS transistor. If the de-attenuation amplifier is embodied as a differential amplifier, then it is possible to provide two NMOS transistors, which may be directly electrically cross-coupled. In this case, a respective terminal of the controlled paths of the NMOS transistors may be connected to one another and, via a current source, to a reference-ground potential terminal.

In a further preferred embodiment of the oscillator circuit, the capacitances in the oscillator core are embodied as varactor diodes with a voltage-dependent capacitance value. These tunable diodes may be fed with a control voltage, for example, at their anode terminal, with which the resonant frequency of the LC oscillator core can be set to form a VCO.

In a further preferred embodiment of the invention, the varactor diodes are directly electrically connected via a contact point in each case to a respective inductor. In this case, the contact point may be a pad at which the cathode terminal of the varactor diode can be electrically contact-connected with bonding wires.

In a further advantageous embodiment of the present invention, the oscillator core and the resonance transformation circuit are formed using symmetrical circuitry for the purpose of carrying differential signals, and the de-attenuation amplifier for providing a negative impedance is a differential amplifier having two transistors that are cross-coupled in a direct electrical connection. In such a symmetrical oscillator circuit, the inductor and the capacitance in the oscillator core are in each case provided twice, as are coupling capacitors and further inductors. The de-attenuation amplifier embodied as a differential amplifier has two cross-coupled transistors to whose source and emitter terminals, respectively, a current source can be connected with respect to the reference-ground potential terminal. The symmetrical embodiment of the oscillator circuit has the advantage, inter alia, of higher signal amplitudes and hence better noise properties and also better electromagnetic compatibility, in particular interference immunity.

In this case, instead of a direct electrical coupling the cross-coupling in the differential amplifier may also be an inductive or a capacitive coupling.

Apart from the inductors of the oscillator core, which are each embodied as a bonding wire, for the rest of the electrical components of the oscillator circuit may be fully integrated monolithically in a chip.

Other features which are considered as characteristic for the invention are set forth in the appended claims.

Although the invention is illustrated and described herein as embodied in an oscillator circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a basic circuit diagram of an exemplary embodiment of a symmetrically constructed oscillator circuit;

FIG. 2 is a perspective illustration of the oscillator circuit of FIG. 1 implemented on a chip with a leadframe; and FIG. 3 is a cross sectional view through the chip and leadframe of FIG. 2.

DESCRIPTION OF THE PREFERRED EMBODIMENTS

Referring now to the figures of the drawing in detail and first, particularly, to FIG. 1 thereof, there is shown an oscillator circuit having an oscillator core OC, a resonance transformation circuit TR and also a de-attenuation amplifier EV. A control voltage US is provided for the purpose of tuning the oscillator, and this control voltage can be fed to the oscillator core OC. Finally, the oscillator circuit has a voltage source VQ, which is connected to a supply potential terminal VCC, on the one hand, and to a reference-ground potential terminal GND, on the other hand. The voltage source VQ supplies the oscillator circuit with a supply voltage.

In detail, the oscillator core includes a capacitance D1 and also a capacitance D1X. The capacitances D1 and D1X are embodied as varactors or as variable-capacitance diodes, each having an anode connected to the anode of the other one. The control voltage US can be fed in at this anodal connecting node of the capacitances D1, D1X. On the cathode side, a contact point P1, P1X is respectively connected to the capacitances D1, D1X via a respective first circuit node K1, K1X. Each inductor L1, L1X is embodied as a bonding wire having a terminal connected to a respective contact point P1, P1X and another terminal connected to the reference-ground potential terminal GND. Overall, the oscillator core OC is thus a tunable parallel resonator having integrated varactor diodes D1, D1X and also bonding wire inductors L1, L1X, i.e. the inductances of the bonding wires.

A resonance transformation circuit TR is connected to each first circuit node K1, K1X. The resonance transformation circuit TR includes two further inductors L2, L2X, each having a respective terminal connected to one another and also connected to the supply potential terminal. The other terminal of each of the inductors L2, L2X forms a respective second circuit node K2, K2X. In this case, the first and second circuit nodes K1, K1X; K2, K2X are coupled to one another via a respective coupling capacitor CK, CKX. The circuit nodes K1, K1X; K2, K2X are embodied symmetrically in this case.

A de-attenuation amplifier EV, embodied as a differential amplifier, is connected to the second circuit node K2, K2X and also to the reference-ground potential terminal GND. The differential amplifier includes two directly electrically cross-coupled transistors T1, T1X, which are NMOS transistors. A current source IQ is connected to the source terminals of the transistors T1, T1X, which are connected to one another. The free terminal of the current source IQ is connected to the reference-ground potential terminal GND.

The resonance transformation circuit TR is embodied as a series resonator, in contrast to the oscillator core OC designed as a parallel resonator. At the first circuit node K1, K1X, the oscillator core OC has a comparatively low oscillation amplitude, which thus prevents the variable-capacitance diodes D1, D1X from becoming conductive. The first circuit node K1, K1X is a low-impedance circuit node in this case. The coupling capacitors CK, CKX, together with the further inductors L2, L2X, which form an integrated series resonant circuit, carry out a resonance transformation which causes a large oscillation amplitude to occur at the second circuit node K2, K2X. In this case, the second circuit node K2, K2X forms a high-impedance circuit node. A conventional amplifier EV suitable for VCO can be operated from the second circuit node K2, K2X, on account of its high-impedance nature, as shown in FIG. 1. The particular feature in this case is that, despite the tunable oscillator core OC which is directly connected to the reference-ground potential terminal, it is possible to use a de-attenuation amplifier with NMOS transistors. NMOS transistors have the advantage over PMOS transistors of a higher transconductance and hence a larger gain. The high-impedance nature of the resonance resistance at the second circuit node K2, K2X enables a small phase noise of the arrangement.

FIG. 2 diagrammatically shows the oscillator circuit of FIG. 1. The rear side of the chip CH is fixed on a leadframe LF. The active front side of the chip CH has contact points P1, P1X. Bonding wires L1, L1X, which serve as inductors in the resonator of the oscillator core, are led from the contact points P1, P1X to the leadframe LF. The chip CH can be contact-connected to pins P in a customary manner using bonding wires BD. The arrangement shown in FIG. 2 may, in a known manner, be encapsulated with plastic by injection-molding or be potted with a potting compound.

Except for the bonding wire inductors L1, L1X, all of the circuit parts of the oscillator circuit OS that are shown in FIG. 1 are completely integrated monolithically on a chip CH. In customary semiconductor processes, the chip substrate is a p-doped substrate, which is tantamount to a substrate terminal of the chip always being the negative supply voltage terminal, which in this case is the reference ground potential terminal GND. The leadframe LF is occasionally referred to as a die pad. The inductors L1, L1X are embodied, then, as a respective bonding wire which is connected on the one hand to the contact point P1 or P1X and on the other hand to the leadframe—that is to say, to the reference-ground potential terminal GND.

FIG. 3 is a cross sectional view taken through the arrangement of FIG. 2 and shows a possible design of the bonding wire inductors L1, L1X. In this case, the rear side of the chip CH is fixed on the leadframe LF using a conductive adhesive KL. A bonding wire L1 is fixed to a contact point P1 on the front side of the chip. The free end of the bonding wire L1 is fixed on the leadframe LF. In this case, the structure of the leadframe LF ensures that the terminals of the bonding wires L1, L1X that are fixed on it are electrically connected to one another and, via the conductive adhesive K1, to the substrate terminal or rear side terminal of the chip CH.

The oscillator circuit described is suitable for applications in the gigahertz range and has a low phase noise.

The differential amplifier in the de-attenuation amplifier EV may equally be constructed using bipolar technology with NPN transistors, instead of the NMOS transistors described.

The bonding wire inductors L1, L1X have a high quality factor. Such bonding wires from contact points (pads) to a leadframe or die pad are occasionally also referred to as base bonds, down bonds, or die bonds.

The particular feature in the case of the present oscillator circuit is that, despite the bonding wire inductors L1, L1X that are directly connected to reference-ground potential, it is nevertheless possible to use NMOS or NPN transistors, which are more favorable from radio frequency and gain standpoints, in the conventional differential amplifier for the de-attenuation of the oscillator.

In this case, the tunable resonator in the oscillator core OC guides the frequency of the integrated series resonant circuit CK, CKX, L2, L2X within its high bandwidth.

Using de-attenuation amplifiers other than the one shown, for example, with transistors that are not directly electrically cross-coupled, but rather are inductively or capacitively cross-coupled, lies within the scope of the invention.

I claim:

1. An oscillator circuit, comprising:
   a supply voltage source having a supply potential terminal and a reference-ground potential terminal;
   a carrier;
   a semiconductor chip having a front side and a rear side fixed to said carrier;
   an oscillator core integrated on said semiconductor chip, said oscillator core including a pair of first circuit nodes, a first capacitance, a first inductor connected to said first capacitance at a first one of said pair of first circuit nodes, a second capacitance, and a second inductor connected to said second capacitance at a second one of said pair of first circuit nodes;
   a de-attenuation amplifier integrated on said semiconductor chip, said de-attenuation amplifier coupled to said oscillator core and to said supply voltage source;
   a resonance transformation circuit for coupling said oscillator core and said de-attenuation amplifier;
   a pair of second circuit nodes;
   a third inductor connected to a first one of said pair of second circuit nodes;
   a fourth inductor connected to a second one of said pair of second circuit nodes; and
   a pair of contact points;
   said first inductor formed as a bonding wire having a first terminal connected to a first one of said pair of contact points and a second terminal connected to said carrier;
   said second inductor formed as a bonding wire having a first terminal connected to a second one of said pair of contact points and a second terminal connected to said carrier;
   said first one of said pair of contact points connected to said first one of said pair of first circuit nodes;
   said second one of said pair of contact points connected to said second one of said pair of first circuit nodes;
   said resonance transformation circuit including a first coupling capacitor connected to said first one of said pair of first circuit nodes and to said first one of said pair of second circuit nodes;
   said resonance transformation circuit including a second coupling capacitor connected to said second one of said pair of first circuit nodes and to said second one of said pair of second circuit nodes.

2. The oscillator circuit according to claim 1, wherein:
   said second terminal of said bonding wire forming said first inductor is connected to said reference-ground potential terminal; and
   said second terminal of said bonding wire forming said second inductor is connected to said reference-ground potential terminal.

3. The oscillator circuit according to claim 1, wherein said semiconductor chip has a p-type substrate.

4. The oscillator circuit according to claim 1, further comprising an adhesive fixing said rear side of said semiconductor chip on said carrier.

5. The oscillator circuit according to claim 1, wherein said de-attenuation amplifier has at least one NMOS transistor.

6. The oscillator circuit according to claim 1, wherein:
   said first capacitance is embodied as a first varactor diode having a voltage-dependent capacitance value; and
   said second capacitance is embodied as a second varactor diode having a voltage-dependent capacitance value.

7. The oscillator circuit according to claim 6, further comprising:
   a terminal for obtaining a control voltage for setting the capacitance value of said first varactor diode and for setting the capacitance value of said second varactor diode;
   said first varactor diode having an anode;
   said second varactor diode having an anode connected to said anode of said first varactor diode; and
   said terminal for obtaining the control voltage connected to said anode of said first varactor diode and to said anode of said second varactor diode.

8. The oscillator circuit according to claim 1, wherein:

said oscillator core and said resonance transformation circuit are symmetrically designed for carrying differential signals; and said de-attenuation amplifier is a differential amplifier having two cross-coupled transistors.

* * * * *